United States Patent
Endo et al.

(10) Patent No.: US 8,906,160 B2
(45) Date of Patent: Dec. 9, 2014

(54) VAPOR BASED PROCESSING SYSTEM WITH PURGE MODE

(75) Inventors: Richard Endo, San Carlos, CA (US); Edward Haywood, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 1021 days.

(21) Appl. No.: 12/978,403

(22) Filed: Dec. 23, 2010

(65) Prior Publication Data
US 2012/0160173 A1    Jun. 28, 2012

(51) Int. Cl.
*C23C 16/455* (2006.01)
*C23C 16/40* (2006.01)
*C23C 16/44* (2006.01)

(52) U.S. Cl.
CPC ....... *C23C 16/45587* (2013.01); *C23C 16/4401* (2013.01); *C23C 16/4408* (2013.01); *C23C 16/4412* (2013.01); *C23C 16/45544* (2013.01); *C23C 16/45565* (2013.01); *C23C 16/45574* (2013.01); *C23C 16/45525* (2013.01)
USPC ................. 118/715; 156/345.29; 156/345.33; 156/345.34

(58) Field of Classification Search
CPC ............ C23C 16/455; C23C 16/45519; C23C 16/45525; C23C 16/45544; C23C 16/45574; C23C 16/45587; C23C 16/4401; C23C 16/4412; C23C 16/45565
USPC ............ 118/715; 156/345.29, 345.33, 345.34
See application file for complete search history.

(56) References Cited

U.S. PATENT DOCUMENTS

| | | | | |
|---|---|---|---|---|
| 6,192,827 | B1* | 2/2001 | Welch et al. | 118/723 E |
| 6,800,173 | B2* | 10/2004 | Chiang et al. | 156/345.33 |
| 7,060,939 | B2* | 6/2006 | Shinya et al. | 219/390 |
| 7,618,493 | B2* | 11/2009 | Yamada et al. | 118/715 |
| 7,699,932 | B2* | 4/2010 | Miller et al. | 118/715 |
| 7,740,705 | B2* | 6/2010 | Li | 118/715 |
| 8,129,288 | B2* | 3/2012 | Shanker et al. | 438/761 |
| 8,148,273 | B1* | 4/2012 | Shanker et al. | 438/761 |
| 8,153,535 | B1* | 4/2012 | Shanker et al. | 438/761 |
| 8,277,888 | B2* | 10/2012 | Dedontney | 427/248.1 |
| 8,293,013 | B2* | 10/2012 | DeDontney | 118/715 |
| 8,334,015 | B2* | 12/2012 | Chiang et al. | 427/248.1 |
| 8,372,758 | B2* | 2/2013 | Shanker et al. | 438/761 |
| 8,409,354 | B2* | 4/2013 | Chiang et al. | 118/719 |
| 8,440,259 | B2* | 5/2013 | Chiang et al. | 427/248.1 |
| 2002/0073924 | A1* | 6/2002 | Chiang et al. | 118/723 R |
| 2002/0144655 | A1* | 10/2002 | Chiang et al. | 118/715 |
| 2004/0129212 | A1* | 7/2004 | Gadgil et al. | 118/715 |
| 2005/0268856 | A1* | 12/2005 | Miller et al. | 118/729 |
| 2006/0090852 | A1* | 5/2006 | Kido et al. | 156/345.33 |
| 2007/0116872 | A1* | 5/2007 | Li et al. | 427/248.1 |
| 2007/0157683 | A1* | 7/2007 | Li | 70/209 |
| 2007/0209590 | A1* | 9/2007 | Li | 118/719 |
| 2007/0212484 | A1* | 9/2007 | Li | 427/248.1 |
| 2007/0215036 | A1* | 9/2007 | Park et al. | 117/88 |
| 2008/0072821 | A1* | 3/2008 | Dalton et al. | 118/715 |

(Continued)

*Primary Examiner* — Jeffrie R Lund

(57) ABSTRACT

Embodiments of the present invention provide vapor deposition tools. In one example, a vapor deposition tool includes housing. A substrate support is positioned within the housing and configured to support a substrate. A backing plate is positioned above the substrate support. A showerhead is positioned between the substrate support and the backing plate and has a plurality of openings therethrough. A fluid trap member is positioned around a periphery of the showerhead. A fluid trap member actuator is coupled to the fluid trap member and configured to move the fluid trap member between first and second positions relative to the backing plate.

14 Claims, 7 Drawing Sheets

(56) References Cited

U.S. PATENT DOCUMENTS

| | | | |
|---|---|---|---|
| 2008/0264340 A1* | 10/2008 | Martinson et al. | 118/715 |
| 2009/0061644 A1* | 3/2009 | Chiang et al. | 438/763 |
| 2009/0061646 A1* | 3/2009 | Chiang et al. | 438/763 |
| 2010/0167551 A1* | 7/2010 | DeDontney | 438/758 |
| 2011/0135842 A1* | 6/2011 | Faguet et al. | 427/569 |
| 2011/0290419 A1* | 12/2011 | Horiguchi et al. | 156/345.29 |
| 2012/0090545 A1* | 4/2012 | Chiang et al. | 118/719 |
| 2012/0090688 A1* | 4/2012 | DeDontney | 137/1 |
| 2012/0160173 A1* | 6/2012 | Endo et al. | 118/728 |
| 2012/0315404 A1* | 12/2012 | Li et al. | 427/569 |
| 2012/0324692 A1* | 12/2012 | DeDontney | 29/407.01 |
| 2012/0325151 A1* | 12/2012 | Belousov et al. | 118/730 |
| 2013/0042811 A1* | 2/2013 | Shanker et al. | 118/723 R |

* cited by examiner

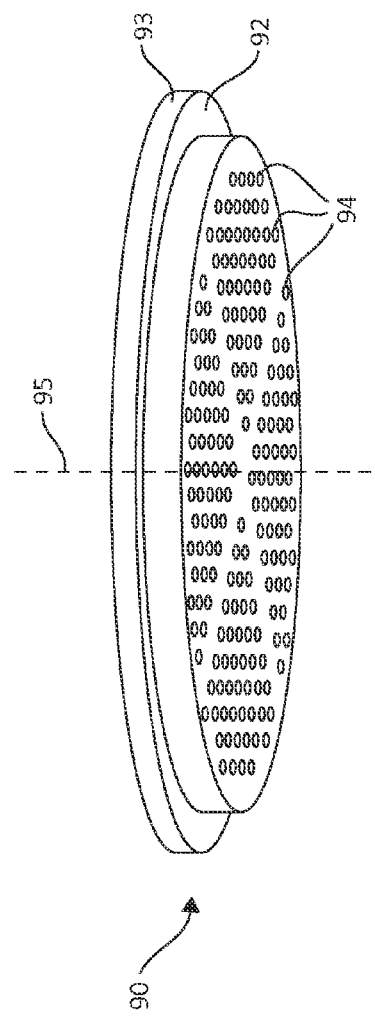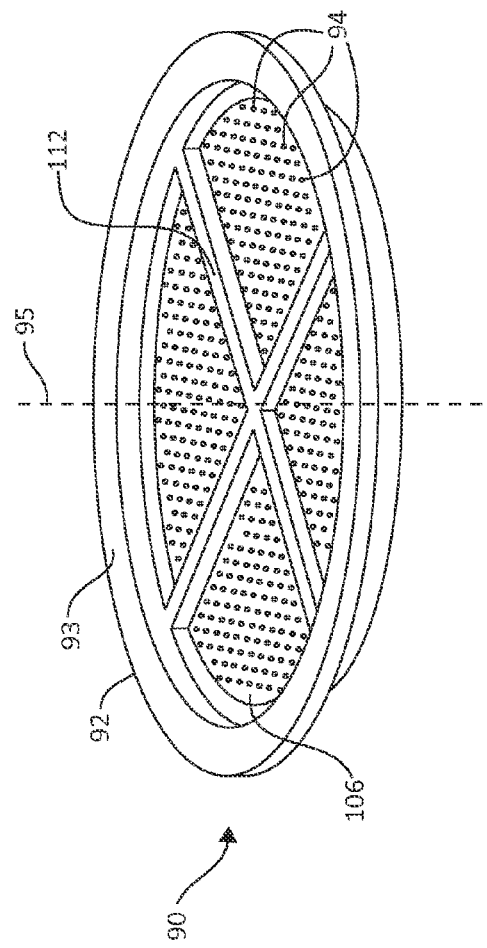

VAPOR BASED PROCESSING SYSTEM WITH PURGE MODE

FIELD OF THE INVENTION

This invention relates to semiconductor processing. More particularly, this invention relates to a processing system and a method for vapor based processing including a purge mode to facilitate, for example, combinatorial film deposition and integration on a substrate.

BACKGROUND OF THE INVENTION

Chemical Vapor Deposition (CVD) is a vapor based deposition process commonly used in semiconductor manufacturing including but not limited to the formation of dielectric layers, conductive layers, semiconducting layers, liners, barriers, adhesion layers, seed layers, stress layers, and fill layers. CVD is typically a thermally driven process whereby the precursor flux(es) is pre-mixed and coincident to the substrate surface to be deposited upon. CVD requires control of the substrate temperature and the incoming precursor flux(es) to achieve desired film materials properties and thickness uniformity. Derivatives of CVD based processes include but are not limited to Plasma Enhanced Chemical Vapor Deposition (PECVD), High-Density Plasma Chemical Vapor Deposition (HDP-CVD), Sub-Atmospheric Chemical Vapor Deposition (SACVD), laser assisted/induced CVD, and ion assisted/induced CVD.

As device geometries shrink and associated film thickness decrease, there is an increasing need for improved control of the deposited layers. A variant of CVD that enables superior step coverage, materials property, and film thickness control is a sequential deposition technique known as Atomic Layer Deposition (ALD). ALD is a multi-step, self-limiting process that includes the use of at least two precursors or reagents. Generally, a first precursor (or reagent) is introduced into a processing chamber containing a substrate and adsorbs on the surface of the substrate. Excess first precursor is purged and/or pumped away. A second precursor (or reagent) is then introduced into the chamber and reacts with the initially adsorbed layer to form a deposited layer via a deposition reaction. The deposition reaction is self-limiting in that the reaction terminates once the initially adsorbed layer is consumed by the second precursor. Excess second precursor is purged and/or pumped away. The aforementioned steps constitute one deposition or ALD "cycle." The process is repeated to form the next layer, with the number of cycles determining the total deposited film thickness. Different sets of precursors can also be chosen to form nano-composites comprised of differing materials compositions. Derivatives of ALD include but are not limited to Plasma Enhanced Atomic Layer Deposition (PEALD), radical assisted/enhanced ALD, laser assisted/induced ALD, and ion assisted/induced ALD.

The purge process typically involves introducing a particular fluid (i.e., a purging or purge gas), such as argon, into the chamber to remove the excess precursor material from the components of the tool, such as the showerhead. Depending on the precursors used, the purge process may be particular difficult and/or time consuming as some precursors have a tendency to "stick" or adhere to the components, particularly those made of aluminum. The invention described herein provides systems and method for improving the efficiency of the purging process used in vapor deposition tools, particularly those used in combinatorial processing.

BRIEF DESCRIPTION OF THE DRAWINGS

Various embodiments of the invention are disclosed in the following detailed description and the accompanying drawings:

FIGS. 2 and 3 are isometric views of a vapor deposition showerhead in accordance with one embodiment of the present invention;

DETAILED DESCRIPTION

Figure 1:
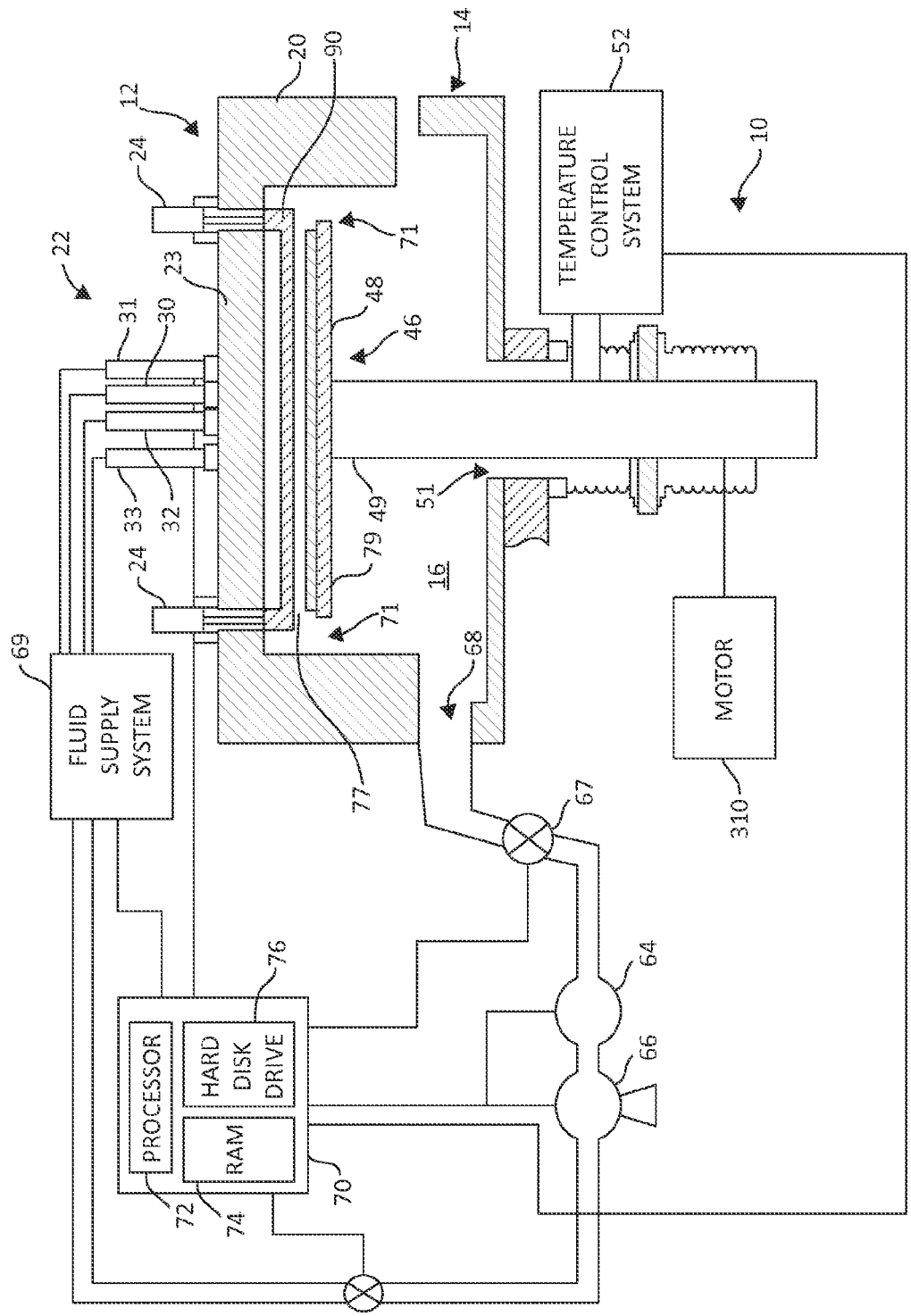
FIG. 1 is a cross-sectional view of a processing system in accordance with one embodiment of the present invention.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description. It should also be noted that the Figures provided herein are illustrative and not necessarily drawn to scale.

The embodiments described herein provide a method and system for vapor based deposition which may be useful for evaluating materials, unit processes, and process integration sequences to improve semiconductor manufacturing operations.

In particular, embodiments of the current invention describe an apparatus and a method to improve the removal of airborne materials from the system for vapor based processing subsequent to the deposition of thin films using the tools. These embodiments may in particular be applied to the removal of "sticky" precursors, which are described in greater detail below, used during the combinatorial research and development of the deposition of new materials in the fields of semiconductor or solar processing. However, it should be understood that embodiments of the present invention may also be applicable to manufacturing processing tools.

It will be obvious to one skilled in the art, that embodiments of the present invention may be practiced without some or all of these specific details. In other instances, well known process operations have not been described in detail in order not to unnecessarily obscure the present invention.

The embodiments described herein enable the application of combinatorial techniques to deposition process sequence integration in order to arrive at a globally optimal sequence of semiconductor manufacturing operations by considering interaction effects between the unit manufacturing operations on multiple regions of a substrate concurrently. Specifically, multiple process conditions may be concurrently employed to affect such unit manufacturing operations, as well as material characteristics of components utilized within the unit manufacturing operations, thereby minimizing the time required to conduct the multiple operations. A global optimum sequence order can also be derived, and as part of this technique, the unit processes, unit process parameters, and materials used in the unit process operations of the optimum sequence order are also considered.

The embodiments are capable of analyzing a portion or sub-set of the overall deposition process sequence used to manufacture a semiconductor device. The process sequence may be one used in the manufacture of integrated circuits (IC) semiconductor devices, flat panel displays, optoelectronics devices, data storage devices, magneto electronic devices, magneto optic devices, packaged devices, and the like. Once the subset of the process sequence is identified for analysis, combinatorial process sequence integration testing is performed to optimize the materials, unit processes and process sequence for that portion of the overall process identified. During the processing of some embodiments described herein, the deposition may be used to form structures or modify structures already formed on the substrate, which structures are equivalent to the structures formed during manufacturing of substrates for production. For example, structures on semiconductor substrates may include, but would not be limited to, trenches, vias, interconnect lines, capping layers, masking layers, diodes, memory elements, gate stacks, transistors, or any other series of layers or unit processes that create a structure found on semiconductor chips. The material, unit process and process sequence variations may also be used to create layers and/or unique material interfaces without creating all or part of an intended structure, which allows more basic research into properties of the resulting materials as opposed to the structures or devices created through the process steps.

Combinatorial processing may also include the use of materials, such as vapor-based precursors, that would not typically be used in manufacturing due to their non-ideal properties. One such type of material is "sticky" precursors. "Sticky" precursors may generally refer to precursors that require more than a particular amount of purging time (e.g., a few minutes) before the reagent is injected into the processing cavity. Without sufficient purging, the residual precursor may react with the reagent behind the showerhead, in the showerhead holes, or on the chamber walls. This can lead to contamination of the wafer and/or clog the holes in the showerhead.

While the combinatorial processing varies certain materials, unit processes, or process sequences, the composition or thickness of the layers or structures or the action of the unit process is preferably substantially uniform within each region, but can vary from region to region per the combinatorial experimentation.

The result is a series of regions on the substrate that contain structures or results of unit process sequences that have been uniformly applied within that region and, as applicable, across different regions through the creation of an array of differently processed regions due to the design of experiment. This process uniformity allows comparison of the properties within and across the different regions such that the variations in test results are due to the varied parameter (e.g., materials, unit processes, unit process parameters, or process sequences) and not the lack of process uniformity. However, non-uniform processing of regions can also be used for certain experiments of types of screening. Namely, gradient processing or regional processing having non-uniformity outside of manufacturing specifications may be used in certain situations.

Combinatorial processing is generally most effective when used in a screening protocol that starts with relatively simple screening, sometimes called primary screening, and moves to more complex screening involving structures and/or electrical results, sometimes called secondary screening, and then moves to analysis of the portion of the process sequence in its entirety, sometimes called tertiary screening. The names for the screening levels and the type of processing and analysis are arbitrary and depend more on the specific experimentation being conducted. Thus, the descriptions above are not meant to be limiting in any fashion. As the screening levels progress, materials and process variations are eliminated, and information is fed back to prior stages to further refine the analysis, so that an optimal solution is derived based upon the initial specification and parameters.

In ALD, examples of conditions that may be varied, include the precursors, reagents, carrier gases, order of precursors, concentration of precursors/reagents, duration of precursor/reagent pulses, purge fluid species, purge fluid duration, partial pressures, total pressure, flow rates, growth rate per cycle, incubation period, growth rate as a function of substrate type, film thickness, film composition, nano-laminates (e.g., stacking of different ALD film types), precursor source temperatures, substrate temperatures, temperature for saturative adsorption, temperature window for ALD, temperature for thermal decomposition of the precursor(s), plasma power for plasma/ion/radical based ALD, etc. A primary screen may start with varying the precursor and purge fluid pulse durations and flows at increasing substrate temperatures to determine the ALD process window (a zone characterized by self-limiting deposition with weak temperature dependence) for a given film type. A secondary screen may entail stacking two or more such ALD films to vary the effective dielectric constant of a film stack in a simple MIM capacitor structure for example. The output of such a screen may be those candidates which yield the highest effective dielectric constant at the lowest leakage and remain stable through a high temperature (e.g. >500° C.) thermal anneal. The system and methods described below are useful to implement combinatorial experimentation as described above, and are particularly useful for ALD and CVD processing.

Fluid as used in this application refers to liquids, gases, vapors, i.e., a component that flows, and other types of fluids used in ALD and CVD processes and their variants and these terms are used interchangeably throughout this specification. A constituent component may be a liquid at some point in the system. The fluid may be converted to a gas, vapor or other such fluid before entering the processing chamber and being exposed to the substrate.

FIG. 1 illustrates a substrate processing system 10 in accordance with one embodiment of the present invention. The substrate processing system 10 includes an enclosure assembly 12 formed from a process-compatible material, such as aluminum or anodized aluminum. The enclosure assembly 12 includes a housing 14, which defines a processing chamber 16, and a vacuum lid assembly 20 covering an opening to the processing chamber 16 at an upper end thereof. Although only shown in cross-section, it should be understood that the process chamber 16 is enclosed on all sides by the housing 14 and/or the vacuum lid assembly 20.

A process fluid injection assembly 22 is mounted to the vacuum lid assembly 20 and includes a plurality of passageways (or injection ports) 30, 31, 32, and 33 and a showerhead 90 to deliver reactive and carrier fluids into the processing chamber 16. In the embodiment depicted in FIG. 1, the showerhead 90 is moveably coupled to an upper portion of the vacuum lid assembly 20 (i.e., a backing plate 23) with a series of pneumatic cylinders 24 mounted to the upper surface of the backing plate 23. As shown, the pneumatic cylinders include pistons 26 which extend through the backing plate 23 and are connected to the showerhead 90. Although only two pneumatic cylinders 24 are shown, it should be understood that four may be provided to actuate the showerhead as described below.

Figure 4:
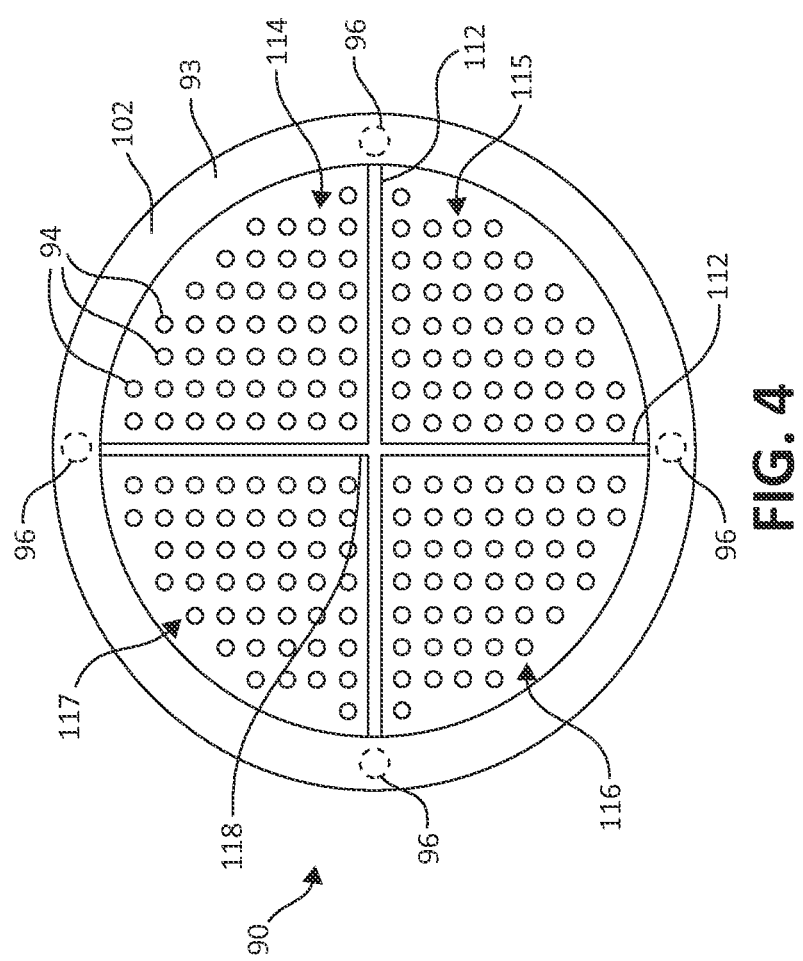
FIG. 4 is a plan view of the showerhead of FIGS. 2 and 3.

FIGS. 2, 3, and 4 illustrate the showerhead 90 according to one embodiment of the present invention. The showerhead 90 includes a main portion 91 and a fluid trap ring (or member) 92. In the depicted embodiment, the main portion 91 is substantially circular and has a diameter of, for example, approximately 200 or 300 millimeters. The main portion 91 includes a plurality of injection ports (or openings) 94 extending therethrough and a fluid separation mechanism 112 extending upwards from an upper surface thereof. Although not shown in detail, each of the injection ports 94 may have a diameter that varies as it extend through the main portion 91, with a larger diameter near the upper surface of the main portion 91 (i.e., adjacent to the fluid separation mechanism).

The fluid separation mechanism 112 includes several substantially linear portions that divide the main portion 91 into four region or quadrants 114, 115, 116, and 117, each of which may be aligned with one of the injection ports 30, 31, 32, and 33 (FIG. 1). The distance that fluid separation mechanism 112 extends from the main body is dependent upon the specific design parameters and may vary in different embodiments. However, in at least some embodiments, the fluid separation mechanism 112 provides sufficient separation to minimize, if not prevent, fluids from diffusing between adjacent quadrants 114-117.

The fluid trap ring 92 is a substantially annular member connected to and extends upwards from a periphery of the main portion 91. As shown, the fluid trap ring 92 includes a lip 93 that extends outwards away from a central axis 95 of the showerhead 90 at an upper portion thereof. Referring FIG. 4 and FIG. 1 in combination, the pistons of the pneumatic cylinders are connected to the lip 93 at the locations indicated by dash circles 96. As will be described in greater detail below, the pneumatic cylinders 24 are used to move the showerhead 90, particularly the fluid trap ring 92, relative to the backing plate 23.

The showerhead 90 may be formed from any known material suitable for the application, including stainless steel, aluminum, anodized aluminum, nickel, ceramics and the like.

Referring again to FIG. 1, the processing system 10 also includes a heater/lift assembly 46 disposed within processing chamber 16. The heater/lift assembly 46 includes a support pedestal (or substrate support) 48 connected to an upper portion of a support shaft 49. The support pedestal 48 is positioned between shaft 49 and backing plate 23 and may be formed from any process-compatible material, including aluminum nitride and aluminum oxide ($Al_2O_3$ or alumina). The support pedestal 48 is configured to hold or support a substrate 79 and may be a vacuum chuck, as is commonly understood, or utilize other conventional techniques, such as an electrostatic chuck (ESC) or physical clamping mechanisms, to prevent the substrate 79 from moving on the support pedestal 48. The support shaft 49 is moveably coupled to the housing 14 so as to vary the distance between support pedestal 48 and the backing plate 23. That is, the support shaft 49 may be vertically moved to vary the distance between the support pedestal 48 and the backing plate 23. In the depicted embodiment, a lower portion of the support shaft 49 is coupled to a motor 310 which is configured to perform this movement. Although not shown, a sensor may provide information concerning the position of the support pedestal 48 within processing chamber 16.

The housing 14 (and/or the vacuum lid assembly), the support pedestal 48, and the showerhead 90 are sized and shaped to create a peripheral flow channel 71 that surrounds the showerhead 90 and the support pedestal 48 and provide a path for fluid flow to a pump channel 68 in the housing 14. The dimensions of peripheral flow channel 71 are defined to provide a desired conductance of processing fluids therethrough which provides flows of processing fluids over the surface of the substrate 79 in a substantially uniform manner and in an axi-symmetric fashion. To this end, the conductance through the pump channel 68 is chosen to be larger than the conductance through the peripheral flow channel 71. In one embodiment, the relative conductance of processing fluids through the pump channel 68 and the peripheral flow channel 71 is, for example, 10:1, wherein the conductance of the pump channel 68 is established to be at least ten (10) times greater than the conductance of processing fluids through the peripheral flow channel 71. Such a large disparity in the conductance, which includes other ratios (e.g., 5:1, 8:1, 15:1 and other higher and lower ratios as applicable to the chamber and application), serves to facilitate axi-symmetric flow across the surface of the substrate 79 through the processing region 77 and subsequently passing the substrate 79 and the support pedestal 48 toward pump channel 68.

The support pedestal 48 may be used to heat the substrate 79 through the use of heating elements (not shown) such as resistive heating elements embedded in the pedestal assembly. In the embodiment shown in FIG. 1, a temperature control system 52 is provided to control the heating elements, as well as maintain the chamber housing 14, vacuum lid assembly 20, and showerhead 90 within desired temperature ranges in a conventional manner.

Still referring to FIG. 1, the processing system 10 also includes a fluid supply system 69 and a controller (or system control system) 70. The fluid supply system 69 is in fluid communication with the passageways 30, 31, 32, and 33 through a sequence of conduits (or fluid lines).

The fluid supply system 69 (and/or the controller 70) controls the flow of processing fluids to, from, and within the processing chamber 16 are with a pressure control system that includes, in the embodiment shown, a turbo pump 64 and a roughing pump 66. The turbo pump 64 and the roughing pump 66 are in fluid communication with processing chamber 16 via a butterfly valve 67 and a pump channel 68.

The controller 70 includes a processor 72 and memory, such as random access memory (RAM) 74 and a hard disk drive 76. The controller 70 is in operable communication with the various other components of the processing system 10, including the turbo pump 64, the temperature control system 52, the fluid supply system 69, the motor 310, and the pneumatic cylinders 24 and controls the operation of the entire processing system to perform the methods and processes described herein.

During operation, the processing system 10 establishes conditions in a processing region 77 between an upper surface of the substrate 79 and the showerhead 90 to form desired material on the surface of the substrate 79, such as a thin film.

Figure 5:
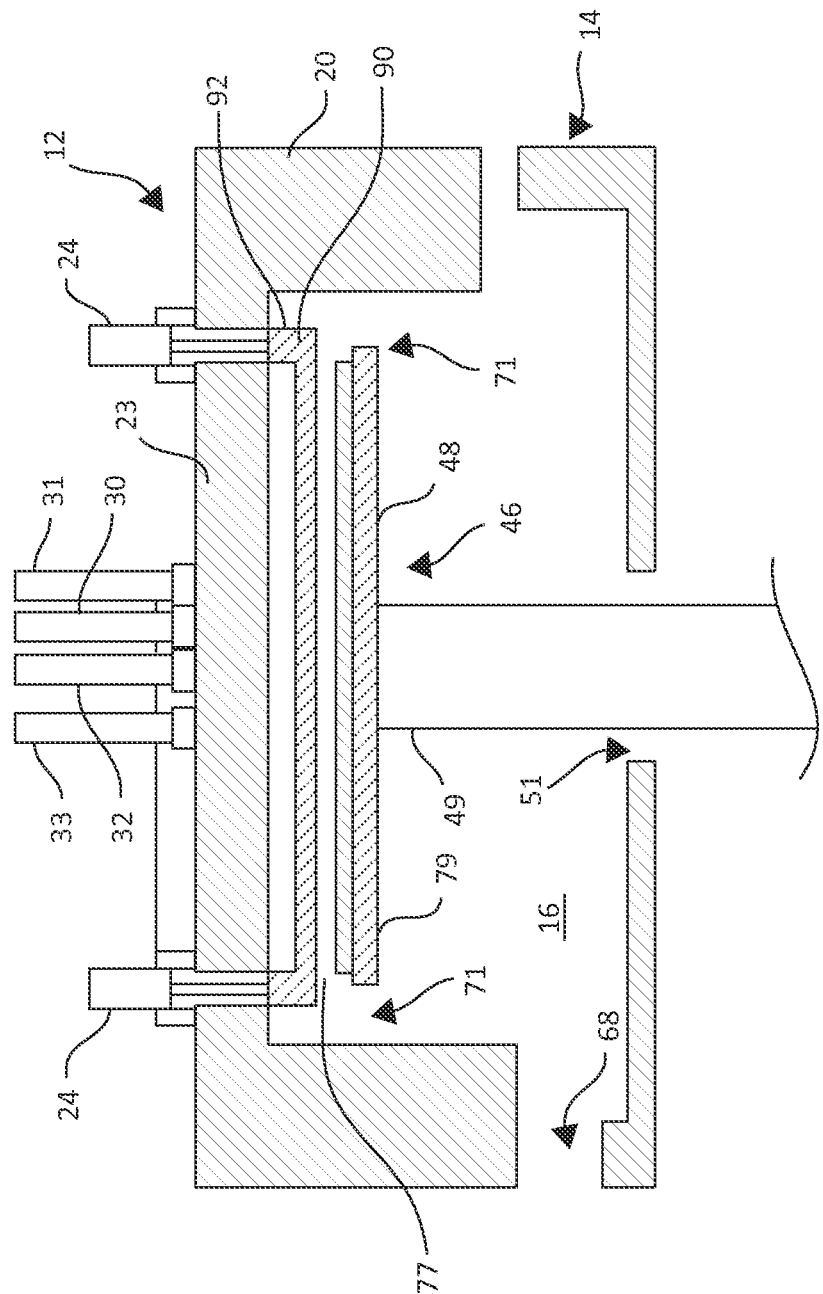
FIGS. 5 and 6 are cross-sectional views of an enclosure assembly in the processing system of FIG. 1, illustrating the operation thereof.

FIG. 5 illustrates the enclosure assembly 12 of the processing system 10 in a processing mode. In the processing mode, the showerhead 90 is positioned by the pneumatic cylinders 24 in a "high" or processing position such that the showerhead 90 (in particular, the fluid trap ring 92 in FIGS. 2, 3, and 4) is in contact with the backing plate 23. Similarly, the support pedestal 48 is positioned by the motor 310 (FIG. 1) in a processing position such that the processing region 77 has a thickness of, for example, between 0.1 and 1.0 inches. When in the processing mode, the processing system 10 forms thin films on the substrate 79 by injecting processing fluids from the fluid supply system 69 (FIG. 1) through the injection ports 30-33 and into the showerhead 90.

As is commonly understood, during an ALD or CVD process, the processing fluids injected into the processing region 77 may include a precursor. In one embodiment, the precursor used is a "sticky" precursor, as described above, such as Tetrakis-ethylmethyl amido Hafnium (TEMAHf) which may be used to form a layer of hafnium oxide ($HfO_2$), perhaps in conjunction with silicon (Si) on the substrate 79.

Referring now to FIGS. 2-5, the fluid trap ring 92 prevents the processing fluids from flowing off the sides of the showerhead 90 such that they flow into the processing region 77 through the openings 94 in the main portion 91 of the showerhead 90. Additionally, because of the fluid separation mechanism 112 of the showerhead 90, unique fluids may be injected into the different quadrants 114-117 by the injection ports 30-33 such that different films may be formed on different portions of the substrate 79. As such, the fluid separation mechanism 112, along with the fluid supply system 69, may provide a variation generating system (or subsystem) that allows the processing system 10 to combinatorially process the substrate 79 by forming a variety of thin films on different portions of the substrate 79. More particularly, the variation generating system allows for intentional variations to be made between the layers formed on different portions of the substrate for the purposes of identifying the materials and/or processes best suited for a particular purpose.

From the processing region 77, the fluids substantially flow in a radial direction (i.e., away from a center of the substrate 79) through the peripheral flow channel 71 and into the pump channel 68. Fluid flow may be assisted by the pressure control system (e.g., the turbo pump 64).

As described above, during the processing mode, various processing fluids, particularly "sticky" precursors, such as TEMAHf, may adhere to various portions of the showerhead 90, such as within the openings 94. In order to remove these processing fluids, one or more purge fluids may be injected into the processing chamber 16.

Figure 6:
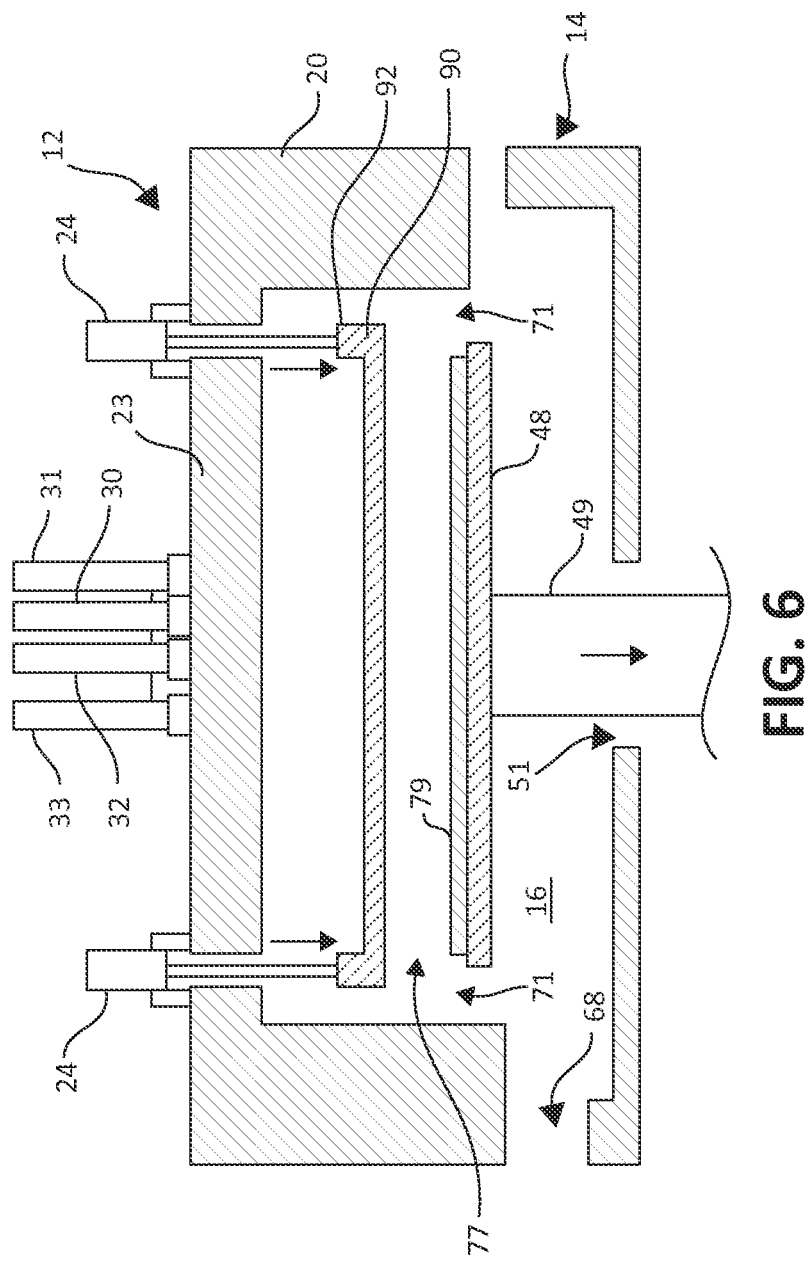

FIG. 6 illustrates the enclosure assembly 12 of the processing system 10 in a purging (or purge) mode. In the purge mode, the showerhead 90 is positioned by the pneumatic cylinders (or fluid trap ring actuators) 24 in a "low" or purge position such that the showerhead 90 (in particular, the fluid trap ring 92 in FIGS. 2, 3, and 4) has been moved downwards, away from the backing plate 23. Similarly, the support pedestal 48 (and/or the support shaft 49) is positioned by the motor 310 (FIG. 1) in a purge position such that the thickness of the processing region 77 has been increased to, for example, between 1.0 and 3.0 inches. When in the purge mode, the processing system 10 injects purge fluids from the fluid supply system 69 (FIG. 1) through the injection ports 30-33 and into the showerhead 90.

Referring now to FIGS. 2-4 and 6, because the showerhead 90 is no longer in contact with the backing plate 23, the fluid trap ring 92 does not prevent the processing fluids from flowing off the sides of the showerhead 90 to the same extent. As such, a substantially portion of the purge fluid flows off the sides of the showerhead 90 and into the peripheral flow channel 71. However, some of the purge fluid does still flow into the processing region 77 through the openings 94 in the main portion 91 of the showerhead 90 before flowing into the peripheral flow channel 71 and the pump channel 68. The overall effect of lowering the showerhead 90, particularly the fluid trap ring 92, during purging, is to increase the fluid conductance experienced by the purge fluids as they flow through the processing chamber 16. As a result, the purge fluids may flow through the processing chamber 16 at an increased rate, thus maximizing the cleaning effect.

This cleaning effect may be improved by the increased fluid conductance between the showerhead 90 and the backing plate 23. That is, when the fluid trap ring 92 is lowered, processing fluids may quickly flow between the showerhead 90 and the backing plate 23, resulting in a greater rate of flow and/or a greater volume of processing gas. In one embodiment, the ratio of fluid conductance with the showerhead 90 (and/or the fluid trap ring 92) in the purge position to the fluid conductance with the showerhead 90 in the processing position is approximately 6:1. Thus, with the showerhead 90 in the purge position, the amount of processing fluid that may flow between the showerhead 90 and the backing plate 23 is approximately six times greater.

Figure 7:
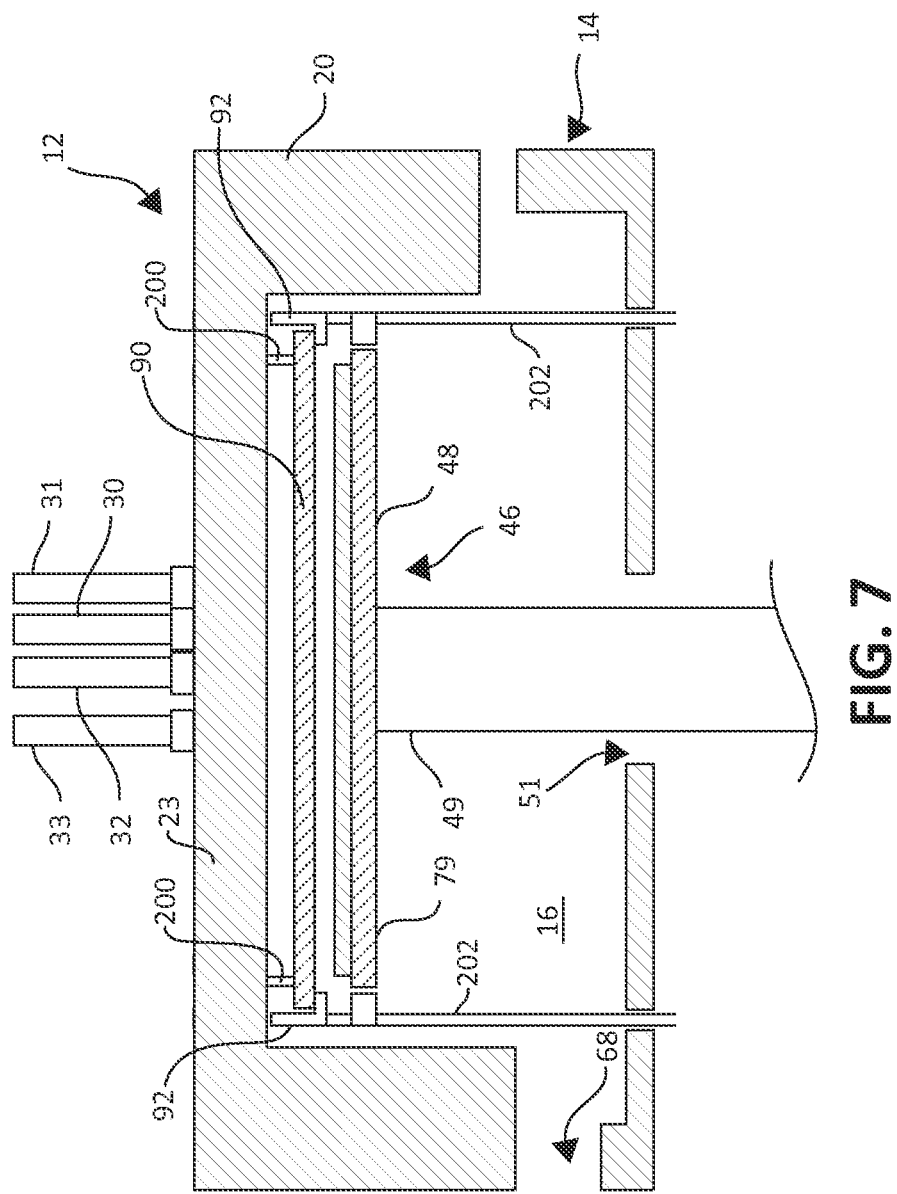
FIGS. 7 and 8 are cross-sectional views of an enclosure assembly according to another embodiment of the present invention.
Figure 8:
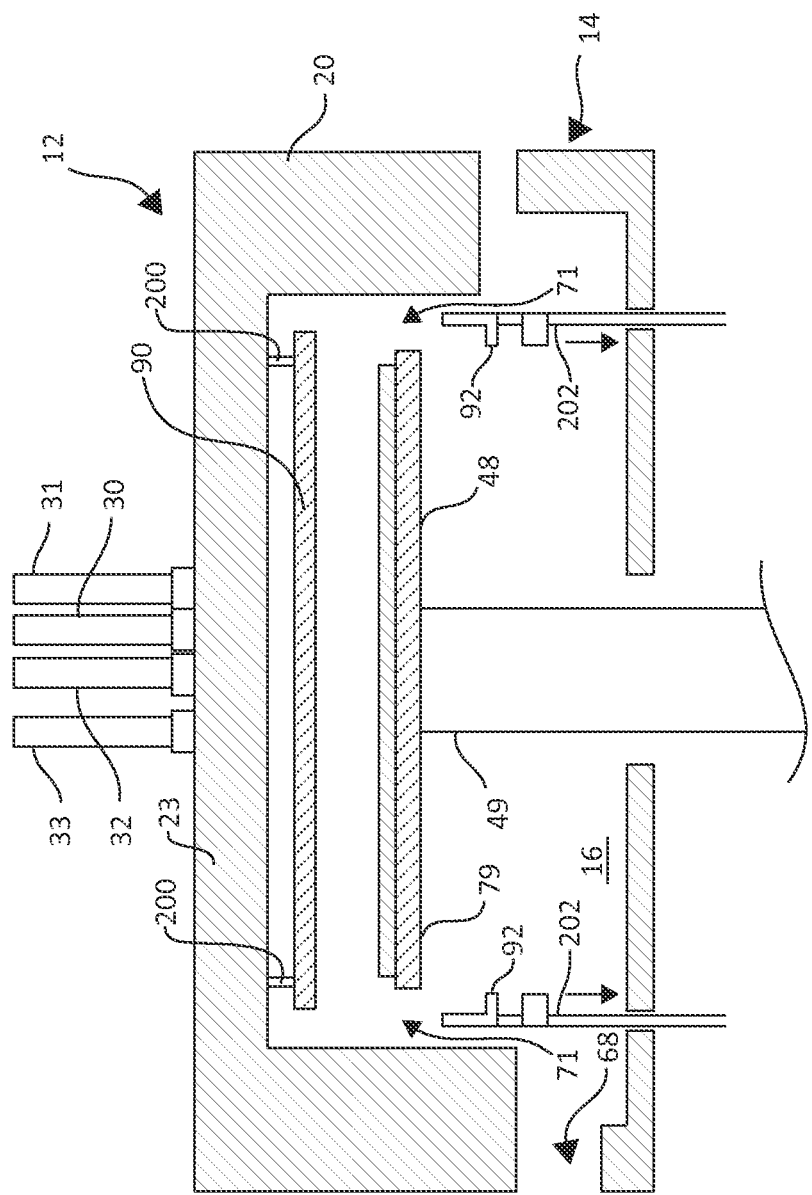

FIGS. 7 and 8 illustrate the enclosure assembly 12 of the processing system 10 according to another embodiment of the present invention. In the embodiment shown in FIGS. 7 and 8, the showerhead 90 is connected to the backing plate 23 by four posts 200, although only two of the posts 200 are shown. Also of particular interest is that the fluid trap ring 92 is not connected to the showerhead 90. Rather, the fluid trap ring 92 is held in position by, in one embodiment, four support rods 202 (only two shown) that extend upwards through the lower portion of the housing 14. Although not shown, the support rods 202 may each be connected to an actuator, similar to the pneumatic actuators 24 shown in FIGS. 1, 5, and 6.

FIG. 7 depicts the enclosure assembly 12 with the processing system 10 in a processing mode. As such, the fluid trap ring 92 is in a high, or processing, position and in contact with the backing plate 23, similar to the embodiment shown in FIG. 5. FIG. 8 depicts the enclosure assembly 12 with the processing system 10 in a purge mode. Thus, the fluid trap ring 92 has been lowered to a purge position such that purging fluid may readily flow off the sides of the showerhead 90 to optimize fluid conductance as described above.

It should be understood that an increase of fluid conductance between the backing plate 23 and the showerhead 90 does occur by simply moving the fluid trap ring 90, as opposed to moving both the showerhead 90 and the fluid trap ring 92 as described above. It should also be understood that although the fluid trap ring 92 is partially positioned with the peripheral flow channel 71 when in the purge position, it may be positioned to minimize any negative affect on fluid conductance, such as by positioning the fluid trap ring 92 just below a periphery of the support pedestal 48.

Although not shown in detail, the fluid supply system 69 may include multiple subsystems to provide various processing fluids to the processing chamber 16. Precursors used may include nitrogen ($N_2$), argon (Ar), water ($H_2O$), ammonia ($NH_3$), oxygen ($O_2$), hydrogen, helium, ozone, silane, and any other precursor and/or carrier or purge fluid(s) (e.g., gases, vapors, etc.) used in ALD or CVD processing, including organometallic and halide precursors. Appropriate inert carrier gases (e.g., Ar 121) may be used to deliver precursors/reagents. Another example of a precursor is TriMethylAluminum (TMA). Alternate sources of Hafnium precursors include but are not limited to Tetrakis-diethylamido Hafnium (TDEAHf), Tetrakis-dimethyl amido Hafnium (TDMAHf), Hafnium tert-butoxide, and Hafnium Chloride.

Characteristics of the layers formed on the substrate that may be varied by the fluid supply system 69 include the precursors, reagents, carrier gases, order of precursors, concentration of precursors/reagents, duration of precursor/reagent pulses, purge fluid species, purge fluid duration, partial pressures, total pressure, flow rates, film thickness, film composition, nano-laminates (e.g. stacking of different ALD film types), etc.

In one embodiment, a vapor deposition tool is provided. The vapor deposition tool includes housing, a substrate support positioned within the housing and configured to support a substrate, a backing plate positioned above the substrate support, a showerhead positioned between the substrate support and the backing plate, the showerhead having a plurality of openings therethrough, a fluid trap member positioned around a periphery of the showerhead, and a fluid trap member actuator coupled to the fluid trap member and configured to move the fluid trap member between first and second positions relative to the backing plate.

In another embodiment, a vapor deposition tool is provided. The vapor deposition tool includes a housing, a substrate support positioned within the housing and configured to support a substrate, a backing plate coupled to the housing and positioned over the substrate support, a showerhead positioned between the substrate support and the backing plate, the showerhead having a plurality of openings therethrough, a fluid trap member positioned around a periphery of the showerhead, and a fluid trap member actuator coupled to the fluid trap member and configured to move the fluid trap member between first and second positions relative to the backing plate. When the fluid trap member is in the first position and processing fluids are injected into the showerhead, the fluid trap member extends at least partially above the showerhead and the processing fluids flow through the plurality of openings in the showerhead and form a film on the substrate. The vapor deposition tool also includes a variation generating system configured to generate a variation between the film deposited on a first portion of the substrate and the film deposited on a second portion of the substrate.

In a further embodiment, a vapor deposition tool is provided. The vapor deposition tool includes a housing, a substrate support positioned within the housing and configured to support a substrate, a backing plate coupled to the housing and positioned over the substrate support, a showerhead positioned between the substrate support and the backing plate, the showerhead having a plurality of openings therethrough, an annular fluid trap member connected to and extending upwards from a periphery of the showerhead, and a fluid trap member actuator coupled to the annular fluid trap member and the showerhead and configured to move the annular fluid trap member and the showerhead between first and second positions relative to the backing plate. When the annular fluid trap member and the showerhead are in the first position and processing fluids are injected into the showerhead, the processing fluids flow through the plurality of openings in the showerhead and form a film on the substrate. The vapor deposition tool also includes a variation generating system configured to generate a variation between the film deposited on a first portion of the substrate and the film deposited on a second portion of the substrate.

Although the invention has been described in terms of specific embodiments, one skilled in the art will recognize that various modifications may be made that are within the scope of the present invention. For example, although four quadrants are shown, any number of quadrants may be provided, depending upon the number of differing process fluids employed to deposit material. Additionally, it is possible to provide the processing volume with a homogenous mixture of constituent components so that the processing chamber may function as a standard processing chamber for either ALD or CVD recipes. Therefore, the scope of the invention should not be limited to the foregoing description. Rather, the scope of the invention should be determined based upon the claims recited herein, including the full scope of equivalents thereof.

What is claimed:

1. A vapor deposition tool comprising:
   a housing;
   a substrate support positioned within the housing and configured to support a substrate;
   a backing plate positioned above the substrate support;
   a showerhead positioned between the substrate support and the backing plate, the showerhead having a plurality of openings therethrough;
   a fluid trap member positioned around a periphery of the showerhead; and
   a fluid trap member actuator coupled to the fluid trap member and configured to move the fluid trap member between first and second positions relative to the backing plate,
   wherein when the fluid trap member is in the first position, a bottom of the fluid trap member is a first distance from the backing plate, the first distance being less than a distance between the backing plate and a top surface of the substrate support, and when the fluid trap member is in the second position, a top of the fluid trap member is a second distance from the backing plate, the second distance being greater than the first distance and greater than a distance between the backing plate and the top surface of the substrate support.

2. The vapor deposition tool of claim 1, wherein when the fluid trap member is in the first position, the fluid trap member at least partially extends above the showerhead.

3. The vapor deposition tool of claim 2, wherein when the fluid trap member is in the second position, the entire fluid trap member is below a substrate positioned on the substrate support.

4. The vapor deposition tool of claim 3, wherein when the fluid trap member is in the first position and processing fluids are injected into the showerhead, the processing fluids flow through the plurality of openings in the showerhead and form a film on the substrate.

5. The vapor deposition tool of claim 4, further comprising a variation generating system configured to generate a variation between the film deposited on a first portion of the substrate and the film deposited on a second portion of the substrate.

6. The vapor deposition tool of claim 3, wherein when the fluid trap member is in the second position, the entire fluid trap member is positioned below the substrate support.

7. The vapor deposition tool of claim 6 wherein when the fluid trap member is in the second position, the fluid trap member is below the showerhead.

8. The vapor deposition tool of claim 6, wherein the variation generating system comprises a fluid separation mechanism connected to the showerhead and configured such that processing fluid injected into a first portion of the showerhead does not diffuse into a second portion of the showerhead.

9. The vapor deposition tool of claim 8, wherein the variation generating system comprises a fluid supply subsystem configured to inject a first processing fluid into the first portion of the showerhead and a second processing fluid into the second portion of the showerhead.

10. The vapor deposition tool of claim 9, wherein at least one of the first processing fluid and the second processing fluid is a vapor deposition precursor fluid.

11. A vapor deposition tool comprising:
    a housing;
    a substrate support positioned within the housing and configured to support a substrate;
a backing plate coupled to the housing and positioned over the substrate support;
a showerhead positioned between the substrate support and the backing plate, the showerhead having a plurality of openings therethrough;
a fluid trap member positioned around a periphery of the showerhead;
a fluid trap member actuator coupled to the fluid trap member and configured to move the fluid trap member between first and second positions relative to the backing plate, wherein when the fluid trap member is in the first position and processing fluids are injected into the showerhead, the fluid trap member extends at least partially above the showerhead, a bottom of the fluid trap member is above a top surface of the substrate support, and the processing fluids flow through the plurality of openings in the showerhead and form a film on the substrate, and when the fluid trap member is in the second position, a top of the fluid trap member is below a top surface of the substrate support; and
a variation generating system configured to generate a variation between the film deposited on a first portion of the substrate and the film deposited on a second portion of the substrate.

12. The vapor deposition tool of claim 11, wherein the variation generating system comprises a fluid separation mechanism connected to the showerhead and configured such that processing fluid injected into a first portion of the showerhead does not diffuse into a second portion of the showerhead.

13. The vapor deposition tool of claim 12, wherein the variation generating system comprises a fluid supply subsystem configured to inject a first processing fluid into the first portion of the showerhead and a second processing fluid into the second portion of the showerhead.

14. The vapor deposition tool of claim 13, wherein at least one of the first processing fluid and the second processing fluid is a vapor deposition precursor fluid.

* * * * *